United States Patent
Purohit et al.

(10) Patent No.: US 12,170,465 B2
(45) Date of Patent: Dec. 17, 2024

(54) ELECTRONIC POWER MODULE

(71) Applicant: Black & Decker Inc., New Britain, CT (US)

(72) Inventors: Madhur M. Purohit, Ellicott City, MD (US); Alastair G. Valentine, Baltimore, MD (US); Joshua M. Lewis, Baltimore, MD (US); Timothy A. Smith, Perry Hall, MD (US); Christopher W. Shook, Bel Air, MD (US)

(73) Assignee: Black & Decker Inc., New Britain, CT (US)

( * ) Notice: Subject to any disclaimer, the term of this patent is extended or adjusted under 35 U.S.C. 154(b) by 203 days.

(21) Appl. No.: 17/587,003

(22) Filed: Jan. 28, 2022

(65) Prior Publication Data

US 2022/0247280 A1 Aug. 4, 2022

Related U.S. Application Data

(60) Provisional application No. 63/145,162, filed on Feb. 3, 2021.

(51) Int. Cl.
| | |
|---|---|
| *H02K 7/14* | (2006.01) |
| *H02K 11/30* | (2016.01) |
| *H05K 7/14* | (2006.01) |

(52) U.S. Cl.
CPC .............. *H02K 11/30* (2016.01); *H02K 7/14* (2013.01); *H05K 7/1432* (2013.01)

(58) Field of Classification Search
CPC .......... H02K 7/00; H02K 7/14; H02K 7/1432; H02K 5/00; H02K 5/10; H02K 5/22;
(Continued)

(56) References Cited

U.S. PATENT DOCUMENTS

| | | |
|---|---|---|
| 5,578,980 A | 11/1996 | Okubo et al. |
| 6,906,438 B2 | 6/2005 | Ursel et al. |

(Continued)

FOREIGN PATENT DOCUMENTS

| | | | |
|---|---|---|---|
| DE | 102017202765 A1 | * | 8/2017 |
| EP | 2407990 A1 | | 1/2012 |

(Continued)

OTHER PUBLICATIONS

EP EESR dated, Jul. 1, 2022 in corresponding EP application No. 22154172.5.

*Primary Examiner* — Tran N Nguyen
(74) *Attorney, Agent, or Firm* — Amir R. Rohani

(57) ABSTRACT

An electronic module for controlling a motor includes a module housing including a bottom surface, walls, and an open face, a printed circuit board (PCB) arranged along a plane within the module housing; a plurality of power terminals; and a plurality of power switches mounted on the PCB to switchably connect a supply of electric power from a power source to the plurality of power terminals. The plurality of power terminals includes first portions projecting outside the module housing through one of the walls along a direction substantially parallel to the plane for coupling to a plurality of wires couplable to the motor, and second portions extending substantially perpendicularly to the plane and electrically contacting the PCB.

18 Claims, 10 Drawing Sheets

(58) Field of Classification Search
CPC ........ H02K 5/225; H02K 11/00; H02K 11/11; H02K 11/28; H02K 11/30; B25B 21/00; B25B 21/02; B25F 5/00
See application file for complete search history.

(56) References Cited

U.S. PATENT DOCUMENTS

| | | | |
|---|---|---|---|
| 7,705,260 B2 | 4/2010 | Xu | |
| 7,872,383 B2 * | 1/2011 | Dubuc | H02K 5/225 |
| | | | 310/71 |
| 8,310,121 B2 | 11/2012 | Fujita et al. | |
| 8,330,066 B2 | 12/2012 | Xu | |
| 8,630,095 B2 | 1/2014 | Minato et al. | |
| 9,025,336 B2 | 5/2015 | Minato et al. | |
| 9,345,150 B2 | 5/2016 | Fukumasu et al. | |
| 9,935,526 B2 | 4/2018 | Kato et al. | |
| 10,596,679 B2 | 3/2020 | Takeda et al. | |
| 2010/0253162 A1 * | 10/2010 | Sakamaki | B25D 16/00 |
| | | | 310/50 |
| 2012/0025643 A1 | 2/2012 | Shibusawa et al. | |
| 2018/0342932 A1 | 11/2018 | Wachter et al. | |
| 2019/0190186 A1 | 6/2019 | Sakurai et al. | |
| 2020/0189064 A1 | 6/2020 | Takeda et al. | |

FOREIGN PATENT DOCUMENTS

| | | |
|---|---|---|
| EP | 2593953 B1 | 11/2015 |
| EP | 2684264 B1 | 5/2016 |
| EP | 3511966 B1 | 8/2020 |
| EP | 3700065 A1 | 8/2020 |

* cited by examiner

ELECTRONIC POWER MODULE

RELATED APPLICATION

This patent application claims the benefit of U.S. Provisional Application No. 63/145,162 filed Feb. 3, 2021, which is incorporated herein by reference in its entirety.

FIELD

This disclosure relates to an electronic power module, particularly one having power components and associated terminals for driving a motor.

BACKGROUND

Use of cordless power tools has increased dramatically in recent years. Cordless power tools provide the ease of a power assisted tool with the convenience of cordless operation. Conventionally, cordless tools have been driven by Permanent Magnet (PM) brushed motors that receive DC power from a battery assembly or converted AC power. In a PM brushed motor, commutation is achieved mechanically via a commutator and a brush system. By contrast, in a brushless DC motor, commutation is achieved electronically by controlling the flow of current to the stator windings. A brushless DC motor includes a rotor for providing rotational energy and a stator for supplying a magnetic field that drives the rotor. Comprising the rotor is a shaft supported by a bearing set on each end and encircled by a permanent magnet (PM) that generates a magnetic field. The stator core mounts around the rotor maintaining an air-gap at all points except for the bearing set interface. Included in the air-gap are sets of stator windings that are typically connected in either a three-phase wye or Delta configuration. Each of the windings is oriented such that it lies parallel to the rotor shaft. Power devices such as MOSFETs are connected in series with each winding to enable power to be selectively applied. When power is applied to a winding, the resulting current in the winding generates a magnetic field that couples to the rotor. The magnetic field associated with the PM in the rotor assembly attempts to align itself with the stator generated magnetic field resulting in rotational movement of the rotor. A control circuit sequentially activates the individual stator coils so that the PM attached to the rotor continuously chases the advancing magnetic field generated by the stator windings. A set of sense magnets coupled to the PMs in the rotor assembly are sensed by a sensor, such as a Hall Effect sensor, to identify the current position of the rotor assembly. Proper timing of the commutation sequence is maintained by monitoring sensors mounted on the rotor shaft or detecting magnetic field peaks or nulls associated with the PM.

Conventionally, power switches are provided within the power tool in close proximity to the motor or within the handle. Electronics including a controller for controlling the power devices are also provided within the handle or in the vicinity of the motor. A trigger switch assembly is also provided, preferable on the handle where it is easy for the user to engage. The controller is coupled to both the trigger assembly and the power devices and regulates the flow of power through the power devices based on, for example, the travel distance of the trigger assembly.

Power switches are configured in a circuit known as an inverter circuit. For a three-phase brushless motor, a series of three high-side switches and three low-side switches are connected to form the inverter circuit. The controller controllers the gates of the power switches. Three outputs of the inverter circuit are outputted via a series of wires to the motor. The wires are often oriented perpendicularly to the circuit board on which the inverter circuit is mounted. In small internal housing volume application, the wires require tight bend radii, which can cause breakage from the circuit board. What is desirable is a reliable design for connecting the wires to the circuit board while reducing wire-up volume.

This section provides background information related to the present disclosure and is not necessarily prior art.

SUMMARY

According to an embodiment of this invention, an electronic module for controlling a motor is provided. The electronic module includes a module housing including a bottom surface, walls, and an open face, a printed circuit board (PCB) arranged along a plane within the module housing; a plurality of power terminals; and a plurality of power switches mounted on the PCB to switchably connect a supply of electric power from a power source to the plurality of power terminals. The plurality of power terminals comprises first portions projecting outside the module housing through one of the walls along a direction substantially parallel to the plane for coupling to a plurality of wires couplable to the motor, and second portions extending substantially perpendicularly to the plane and electrically contacting the PCB.

In an embodiment, the plurality of power terminals comprises third portions extending perpendicularly from inner ends of the first portions to the second portions along the plane. In an embodiment, the third portions are embedded within the bottom surface of the module housing.

In an embodiment, the first portions are at least partially embedded within the bottom surface of the module housing.

In an embodiment, the module housing is formed via a molding process to partially cover both surfaces of the first portion.

In an embodiment, the module housing includes inner posts formed along one of the walls around at least portions of the second portions of the plurality of power terminals.

In an embodiment, the module housing includes retaining features to support the PCB at a distance from the bottom surface.

In an embodiment, the walls include two side walls extending along a longitudinal axis of the PCB and a front wall, wherein the first portions of the plurality of power terminals extend through the front wall.

In an embodiment, the front wall has a maximum width of approximately less than or equal to 28 mm and a maximum height of approximately less than or equal to 12 mm, and the power switches are configured to deliver at least approximately 600 watts of the electric power to the motor.

In an embodiment, the electronic module is capable of being received within a peripheral envelope having an area that is smaller than or equal to approximately 284 mm^2.

In an embodiment, a power tool is provided including a tool housing, an electric motor disposed in the housing, and an electronic module as described above also disposed in a gripping handle of the housing.

BRIEF DESCRIPTION OF THE DRAWINGS

The drawings described herein are for illustration purposes only and are not intended to limit the scope of this disclosure in any way.

DETAILED DESCRIPTION

Figure 1:
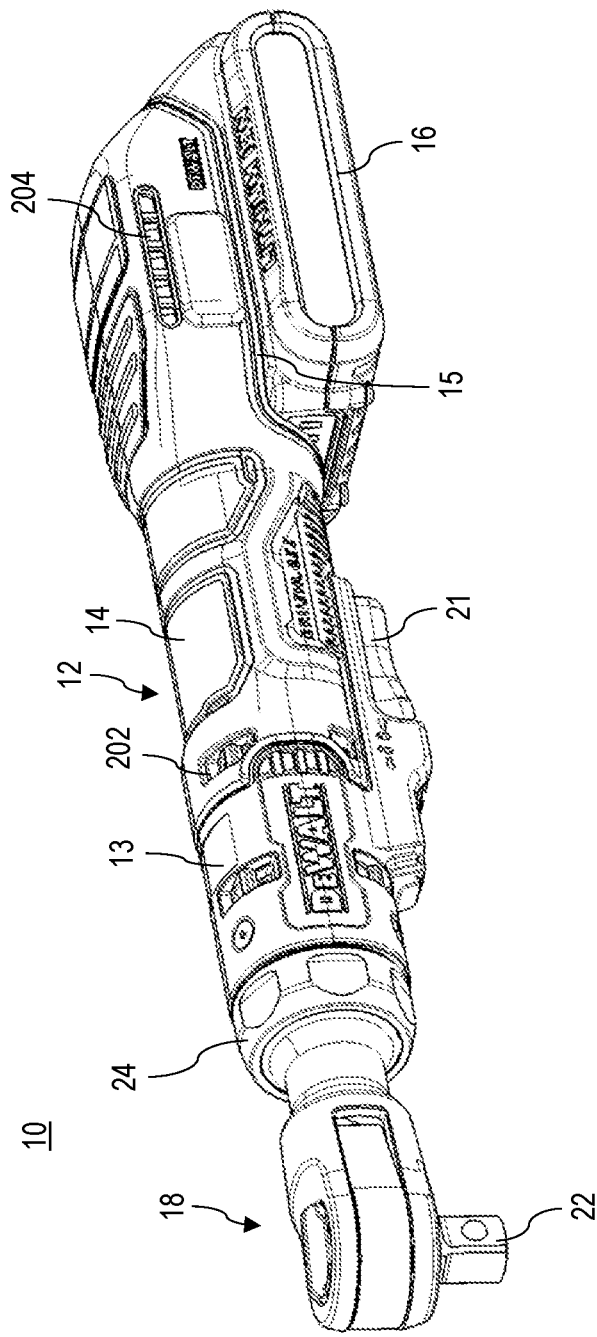
FIG. 1 depicts a perspective view of a power tool including a brushless DC (BLDC) motor and an electronic power module for driving the motor, according to an embodiment.

The following description illustrates the claimed invention by way of example and not by way of limitation. The description clearly enables one skilled in the art to make and use the disclosure, describes several embodiments, adaptations, variations, alternatives, and uses of the disclosure, including what is presently believed to be the best mode of carrying out the claimed invention. Additionally, it is to be understood that the disclosure is not limited in its application to the details of construction and the arrangements of components set forth in the following description or illustrated in the drawings. The disclosure is capable of other embodiments and of being practiced or being carried out in various ways. Also, it is to be understood that the phraseology and terminology used herein is for the purpose of description and should not be regarded as limiting.

Figure 2:
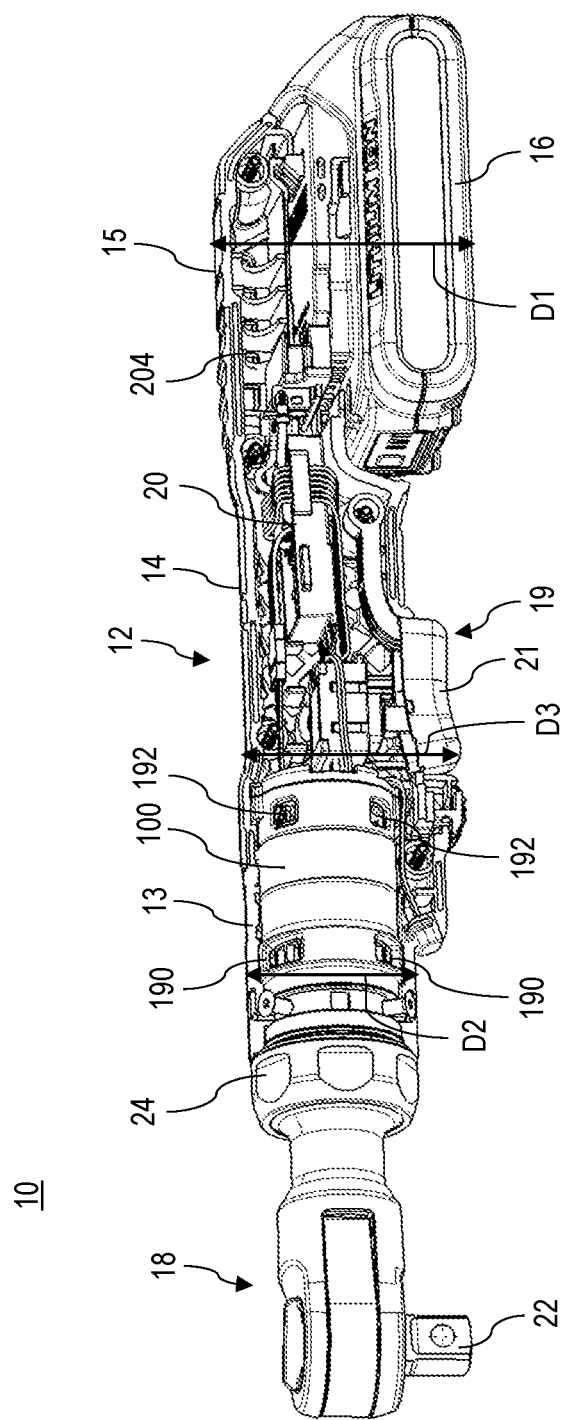
FIG. 2 depicts a side view of the power tool with a part of the housing removed, according to an embodiment.

Referring to FIGS. 1-2, an electric power tool 10 is briefly described herein, according to an embodiment. In an embodiment, power tool 10, which in this exemplary embodiment is an electric ratchet wrench for applying torque to a fastener, includes a housing 12 formed by two clam shells. The housing 12 is elongated along a longitudinal axis and includes a motor case 13 within which an electric brushless motor 100 is disposed, a handle portion 14 extending rearwardly from the motor case 13 within which an electronic power module 20 is supported, and a battery receiving portion 15 disposed at a rear end of the handle portion 14.

The electronic power module 20 is thus disposed between the battery receiving portion 15 and the motor 100. In an embodiment, the electronic power module 20 includes control and switching components, for example an inverter switch circuit including a series of high-side and low-side power switches connected together to form a three-phase inverter bridge, and a programmable microcontroller that controls the gates of the power switches to control a supply of electric current to the motor 100. In an embodiment, a trigger assembly 19 is mounted on the handle portion 14 of the housing 12 that electrically communicates with the electronic power module 20. In an embodiment, the trigger assembly 19 includes a trigger switch 21 engageable by a user. Actuation of the trigger switch 21 sends a signal to the controller to begin operating the motor 100.

In an embodiment, the battery receiving portion 15 is configured to receive and lock in a sliding battery pack 16, such as a 20V Max power tool battery pack. In an embodiment, the battery receiving portion 15 allows the battery pack 16 to be received along a sliding axis that is substantially parallel to the longitudinal axis of the housing 12. This ensures that the battery pack 16 is contained within approximately an envelope of the housing 12. In an embodiment, when viewed from a side, the total width D1 of the battery receiving portion 15 plus the battery pack 16 is between approximately 25% to 40% greater than a width D2 of the motor case formed around the motor 100, and between approximately 15% to 25% greater than a width D3 formed by the trigger switch 21 and the handle portion 14.

In an embodiment, a ratchet head 18 is mounted on a front end of the housing 12 forward of the motor case 13. In an embodiment, motor 100 is orientated along the longitudinal axis of the housing 12 to provide a rotary output to the ratchet head 18 to drive an output member 22. In an embodiment, a nut 24 is mounted at the end of the housing 12 to secure the ratchet head 18 to the motor 100.

Figure 3:
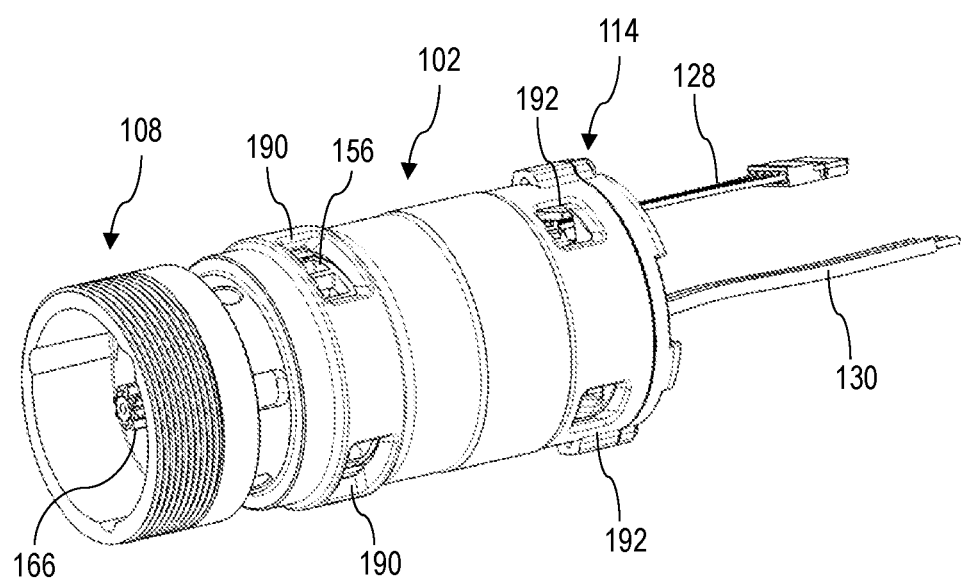
FIG. 3 depicts a perspective view of the BLDC motor, according to an embodiment.
Figure 4:
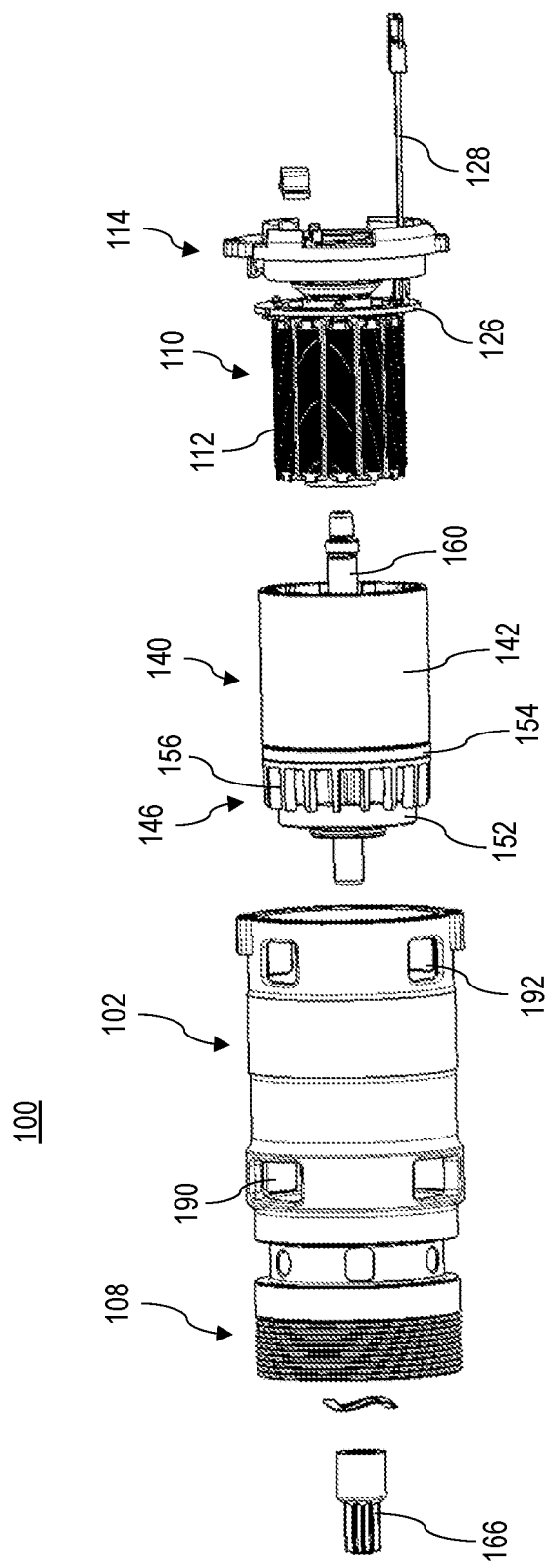
FIG. 4 depicts an exploded view of the BLDC motor, according to an embodiment.
Figure 5:
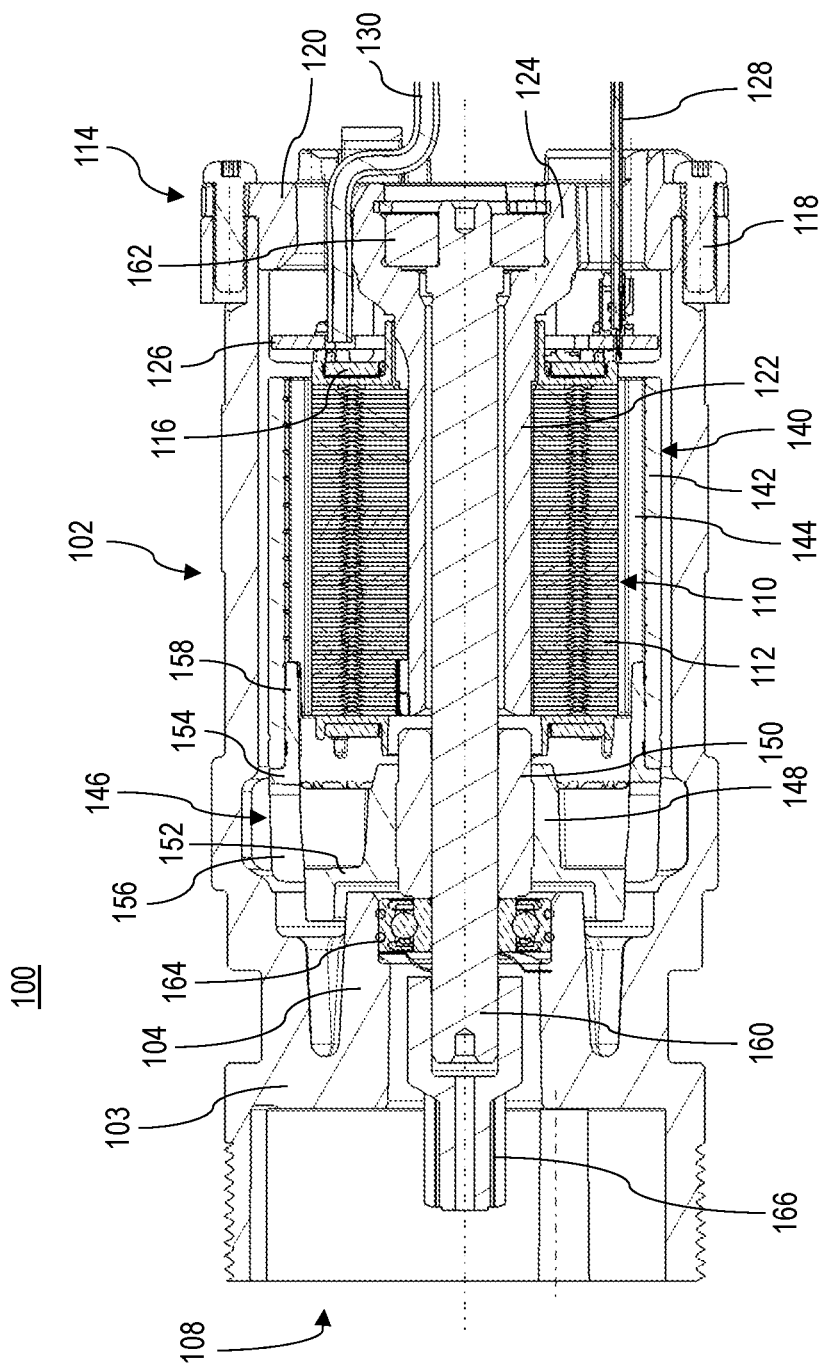
FIG. 5 depicts a side cross-sectional view of the BLDC motor, according to an embodiment.

FIG. 3 depicts a side perspective view of the motor 100, according to an embodiment. FIG. 4 depicts a side exploded view of the motor 100, according to an embodiment. FIG. 5 depicts a side cross-sectional view of the motor 100, according to an embodiment.

As shown in these figures, motor 100 is an outer-rotor brushless (BLDC) motor 100 contained in a motor can (or motor housing) 102. In an embodiment, motor 100 includes an inner stator assembly 110 disposed within an outer rotor assembly 140, according to an embodiment.

In an embodiment, stator assembly 110 includes a stator lamination stack 112 formed by a series of steel laminations. The stator lamination stack 112 is mounted on a stator mount 114 and supports a series of stator windings 116. In an exemplary embodiment, the stator windings 116 are wound in three phases, which, when respectively energized by the battery pack through the electronic power module 20, cause rotation of the rotor assembly 140. Further, in an embodiment, a set of power wires 130 are received through the stator mount 114 and coupled to the stator windings 116.

In an embodiment, the stator mount 114 includes an elongated cylindrical portion 122 sized to be received securely within a central aperture of the stator lamination stack 112. In an embodiment, the stator lamination stack 112 may be press-fitted over the cylindrical portion 122 of the stator mount 114. In an embodiment, stator mount 114 further includes a radial body 120 at an end of the cylindrical portion 122 outside the body of the stator lamination stack 112. The radial body 120 forms a center bearing support pocket 124, which securely receives a rear bearing 162 of the rotor assembly 140.

In an embodiment, a positional sensor board 126 is mounted on an end of the stator lamination stack 112, between the stator lamination stack 112 and the stator mount 114. In an embodiment, the positional sensor board 126 includes a series of Hall sensors positioned for sensing a rotary position of the rotor assembly 140. A set of signal wires 128 are secured to the positional sensor board 126 to carry signals from the Hall sensors to the microcontroller within the electronic power module 20.

In an embodiment, rotor assembly 140 includes a cylindrical rotor core 142 formed around the stator assembly 110, and a series of permanent magnets 144 surface-mounted on the inner surface of the rotor core 142 facing the stator assembly 110 with a small airgap therebetween. As the stator windings 116 are energized in a controlled pattern, they magnetically interact with permanent magnets 144, thus causing the rotation of the rotor. In an embodiment, the rotor assembly 140 mounted securely on a rotor shaft 160 via a rotor mount 146. Rotation of the rotor assembly 140 causes rotation of the rotor shaft 160. A pinion 166 is mounted on a front end of the rotor shaft 160 for coupling the rotor shaft 160 to gear components (not shown) of the ratchet head 18.

In an embodiment, rotor mount 146 includes an inner body 148 that is substantially cylindrical and is mounted on the rotor shaft 160 via a bushing 150. The rotor mount 146 further includes a radial body 152 extending from the inner body 148 and an outer ring 154 that is securely coupled to the end of the rotor core 142 via a lip 158 shaped to be form-fittingly received through the end of the rotor core 143. A fan 156 is formed by a series of spaced-apart fan blades extending between the radial body 152 and the outer ring 154. As the rotor assembly 140 is rotated, the fan 156 generates an airflow through the stator assembly 110 and the rotor assembly 140.

U.S. patent application Ser. No. 17/125,031 filed Dec. 17, 2020, which is incorporated herein by reference in its entirety, provides further detail on the features described above and is referenced for further detail.

In an embodiment, motor can 102 includes a generally cylindrical body having two open ends. The stator assembly 110 and rotor assembly 140 are received within the motor can 102, with an air gap maintained between the rotor core 142 and the inner surface of the motor can 102.

In an embodiment, the stator mount 114 is secured to one end of the motor can 102 via a set of fasteners 118. Since the cylindrical portion 122 of the stator mount 114 supports the stator assembly 110, the stator mount 114 provides structural support for the stator assembly 110 relative to the motor can 102.

In an embodiment, the rotor mount 146 is received within the motor can 102 along with the rotor assembly 140. The motor can 102 includes a radial wall 103 that projects inwardly and forms a bearing support pocket 104 adjacent the rotor mount 146. The bearing support pocket 104 receives a front bearing 164 of the rotor shaft 160. Further, since the bearing support pocket 124 of the stator mount 114 supports the rear bearing 162, the stator mount 114 and the motor can 102 cooperatively provides structural support for the rotor assembly 140 to be freely rotatably within the motor can 102. In an embodiment, the rotor shaft 160 extends through the bearing support pocket 104. The pinion 166, which is coupled to the end of the rotor shaft 160, is provided within the front portion 108 of the motor can 102.

Figure 6:
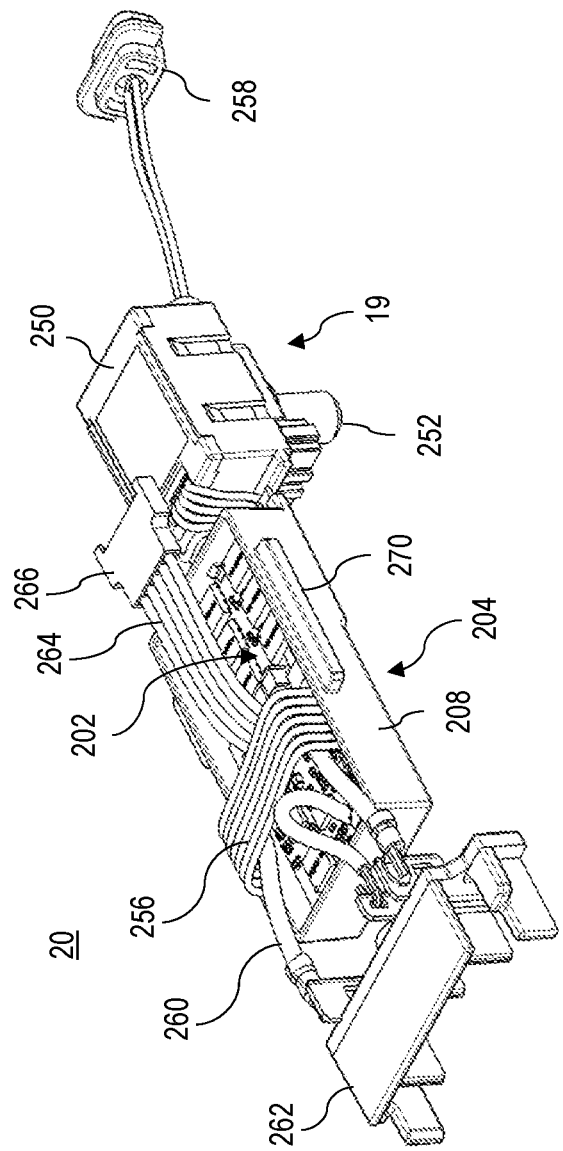
FIG. 6 depicts a perspective view of the electronic power module, according to an embodiment.
Figure 7:
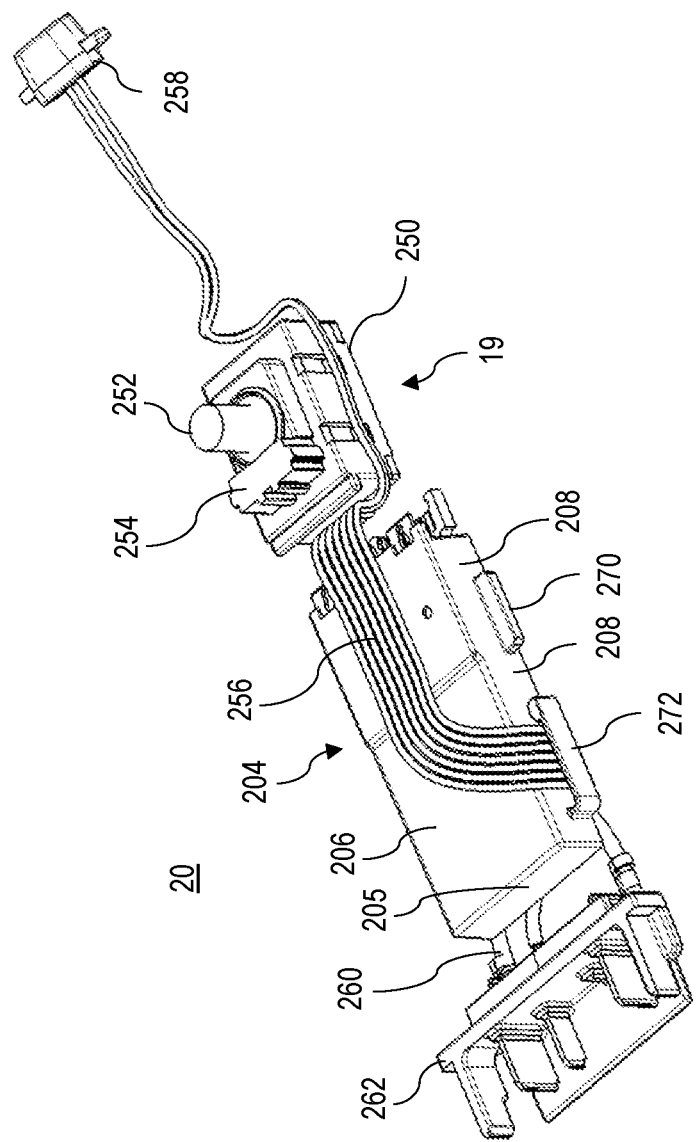
FIG. 7 depicts another perspective view of the electronic power module, according to an embodiment.
Figure 8:
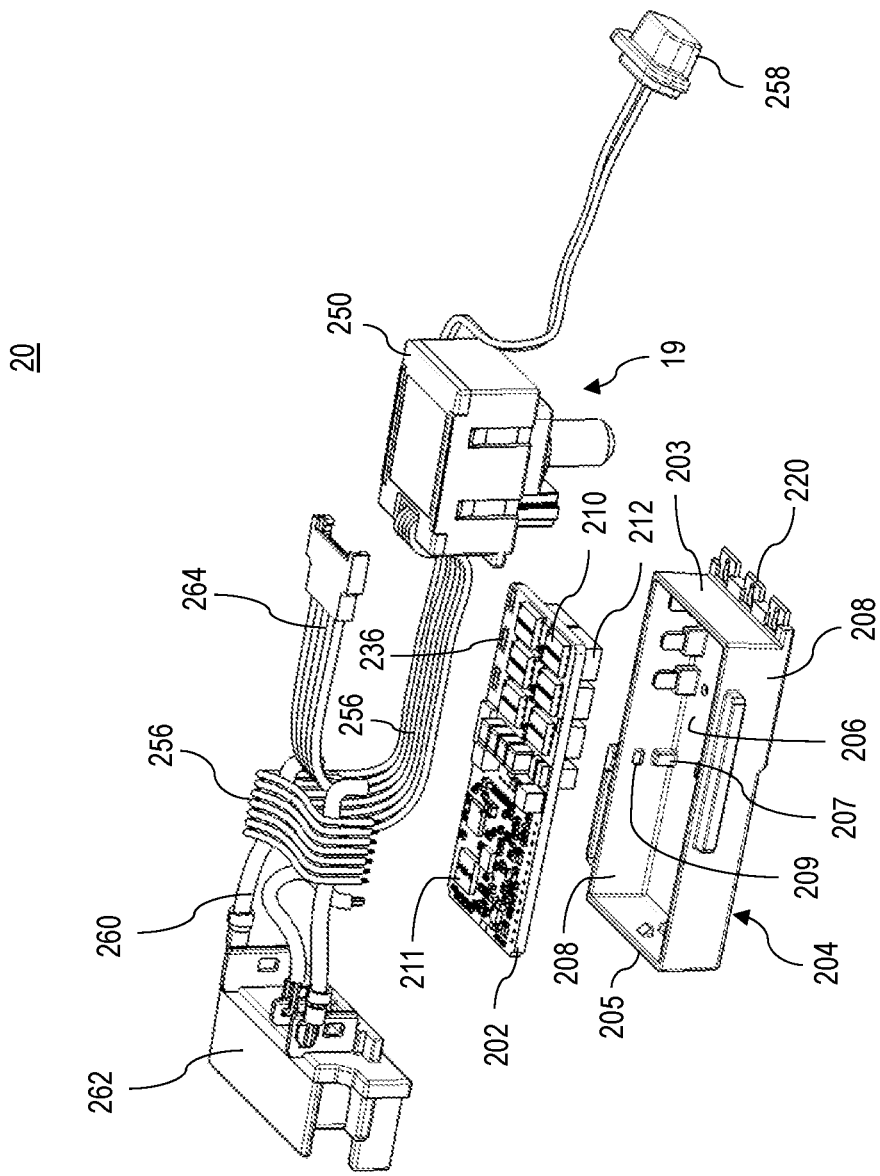
FIG. 8 depicts an exploded view of the electronic power module, according to an embodiment.

FIGS. 6 and 7 depicts perspective views of the electronic power module 20, according to an embodiment. FIG. 8 depicts an exploded view of the electronic power module 20, according to an embodiment.

It is noted that while the electronic power module 20 is described here for use with an outer-rotor motor and in an electric ratchet, it should be understood that the electronic power module 20 may be utilized for controlling any phase-controlled motor including inner-rotor and outer-rotor brushless motors, in sensed or sensorless control, and in any power tool, appliance, or outdoor equipment, including but not limited to, a hand-held impact driver, cut-out tool, impact wrench, nailer, fastener, cutter, sander, drill, saw, grinder, polisher, mower, trimmer, edger, vacuum cleaner, etc.

The electronic control module 20, in an embodiment, includes a printed circuit board (PCB) 202 arranged and mounted inside a module housing 204. Module housing 204 includes a bottom wall 206, two side walls 208 formed longitudinally along the PCB 202, a rear wall 205, and a front wall 203. Rear and front walls 205 and 203 are arranged perpendicularly from the ends of the side walls 208, and together with the side walls 208 form an open face of the module housing 204. In an embodiment, PCB 202 is inserted through the open face and secured inside the module housing 204. Module housing 204 further includes a first set of retention features 207 projecting from the bottom wall 206 along the side walls 208 that engage a lower surface of the PCB 202 for securely holding the PCB 202 at a distance from the bottom wall 206. Module housing 204 further additionally includes a second set of retention features 209 projecting from the sidewalls 208 and positioned to engage and retain an upper surface of the PCB 202. In an embodiment, the second set of retention features 209 includes a sloped outer profile providing a snap-fit retention mechanism for the PCB 202. In an embodiment, module housing 204 forms a potting boat for containment of potting compound (not shown) around the two surfaces of the PCB 202 and its components.

According to an embodiment, electronic power module 20 includes a controller 211 and a series of power switches 210. In an embodiment, controller 211 may be mounted to the lower or the upper surface of the PCB 202 and be in electronic communication with the rest of the PCB 202 components. In an embodiment, the controller 211 may be a programmable micro-controller, micro-processor, or other processing unit capable of controlling the motor and various aspects of power tool 10. For example, controller 211 may be programmed to turn on and off power switches 210 to control commutation of the brushless motor 100. In an embodiment, controller 211 may be coupled to a series of gate drivers disposed on the PCB 202, which in turn are connected to the gates of the power switches 210. Alternatively, the controller 211 may be a circuit chip that includes both a micro-controller and the gate drivers and be coupled directly to the gates of the power switches 210. Using the gate drivers, the controller drives the power switches 210 selectively to commutate the motor 100 and control the speed of the motor 100. Additionally, the controller 211 may be programmed to various tool and battery pack operation features, such as tool and/or temperature control, battery pack voltage control, and tool over-current detection and control, etc. In an alternative embodiment, the controller 211 may be an Application Specific Integrated Circuit (ASIC) configured to control the aforementioned aspects of the motor, battery, and power tool.

In an exemplary embodiment, power switches 110 may be Field Effect Transistors (FETs). In an embodiment, six power switches 110, including three high-side power switches and three low-side power switches, are arranged and coupled together as a three-phase bridge rectifier circuit. Using the gate drivers, the controller 211 controllably drives the power switches 210 within each phase of the motor commutation based on an input from the trigger assembly 19.

In this exemplary embodiment, power tool 10 is a single speed tool, and the trigger assembly 19 includes merely a push-button to activate or deactivate the motor. Alternatively, in an embodiment, power tool 10 is a variable-speed tool, and the controller 211 performs pulse-width modulation (PWM) of the power switches 210 within each phase to regulate the speed of the motor based on a speed signal received from trigger assembly 19. In an embodiment, trigger assembly 19 may include a potentiometer or a resistor circuit configured to output a variable speed signal.

In an embodiment, trigger assembly 19 includes a main housing 250 and a plunger 252 mounted on the housing 250 that is actuated via the trigger switch 21 to generate the variable speed and/or ON/OFF signals. In an embodiment, trigger assembly 19 may further include a forward/reverse actuator 254, which may be used in some tools to set the rotational direction of the motor 100. In an embodiment, a set of signal wires 256 are routed from the trigger assembly 19 to the PCB 202, carrying ON/OFF, variable speed, and direction signals to the PCB 202. In an embodiment, a LED 258 may be additionally coupled to the trigger assembly 19, which turns ON when the trigger switch 21 is actuated by the user.

While the trigger assembly 19 in this example is provided separately from the electronic control module 20, in an alternative embodiment, electronic power module 20 may integrally incorporate all the trigger assembly components to reduce wiring. Reference is made to U.S. Pat. Nos. 9,812,930; 10,497,524; and 10,541,588, an examples of electronic control modules that integrally include a trigger switch assembly in addition to power and control components.

In an embodiment, a set of input wires 260 are electrically coupled between the PCB 202 and a battery terminal block 262. Terminal block 262 couples to battery pack 16. Input wires 260 include plus and minus power wires and battery management control and signal wires.

In an embodiment, a set of control signal wires 264 are additionally mounted on the PCB 202 on one end and coupled to a connector 266 on another end. Control signal wires 264 may be include communication signals between the controller 211 and other motor and tool components. In an embodiment, at least a subset of the control signal wires 264 are Hall sensor signals received from the positional sensor board 126.

In an embodiment, module housing 204 includes side ribs 270 extending longitudinally along the outer surface of the side walls 208. Tool housing 12 includes retention features that engage the side ribs 270 to securely retain the module housing 204. Additionally, in an embodiment, module housing 204 includes wire traps 272 along one of the side walls 208 for guiding the signal wires 256 to pass along the side wall 208 the outside surface the bottom wall 206.

It is noted that while the power switches 210 discussed herein are FETs, other types of power switches such as BJTs or IGBTs may be utilized. Additionally, while power switches 210 are arranged as a three-phase bridge rectifier for driving a three-phase brushless motor, other number and arrangement of power switches may be used to drive other types of motors, including brushed or brushless motors.

In an embodiment, a series of discrete heat sinks 212 are mounted on the PCB 202 opposite the power switches 210. The heat sinks 212 are arranged to transfer heat away from the power switches 210. In an embodiment, a series of thermal vias (not shown) are formed through the PCB 202 to thermally couple the heat sinks 212 to the corresponding power switches 210. In an embodiment, the heat sinks 212 are mounted on a lower surface of the PCB 202 facing the bottom wall 206 of the module housing 204. Alternatively, power switches 210 may be provided facing the bottom wall 206, and heat sinks 212 exposed through the open face of the module housing 204. In yet another embodiment, heat sinks 212 are mounted on top of corresponding power switches 210.

In an embodiment, a series of output power terminals 220 are provided to carry electric power from the inverter circuit formed by the power switches 210 to the motor 100. Where motor is a three-phase brushless motor, a series of three power terminals 220 are provided corresponding to the three phases of the motor 100.

Figure 9:
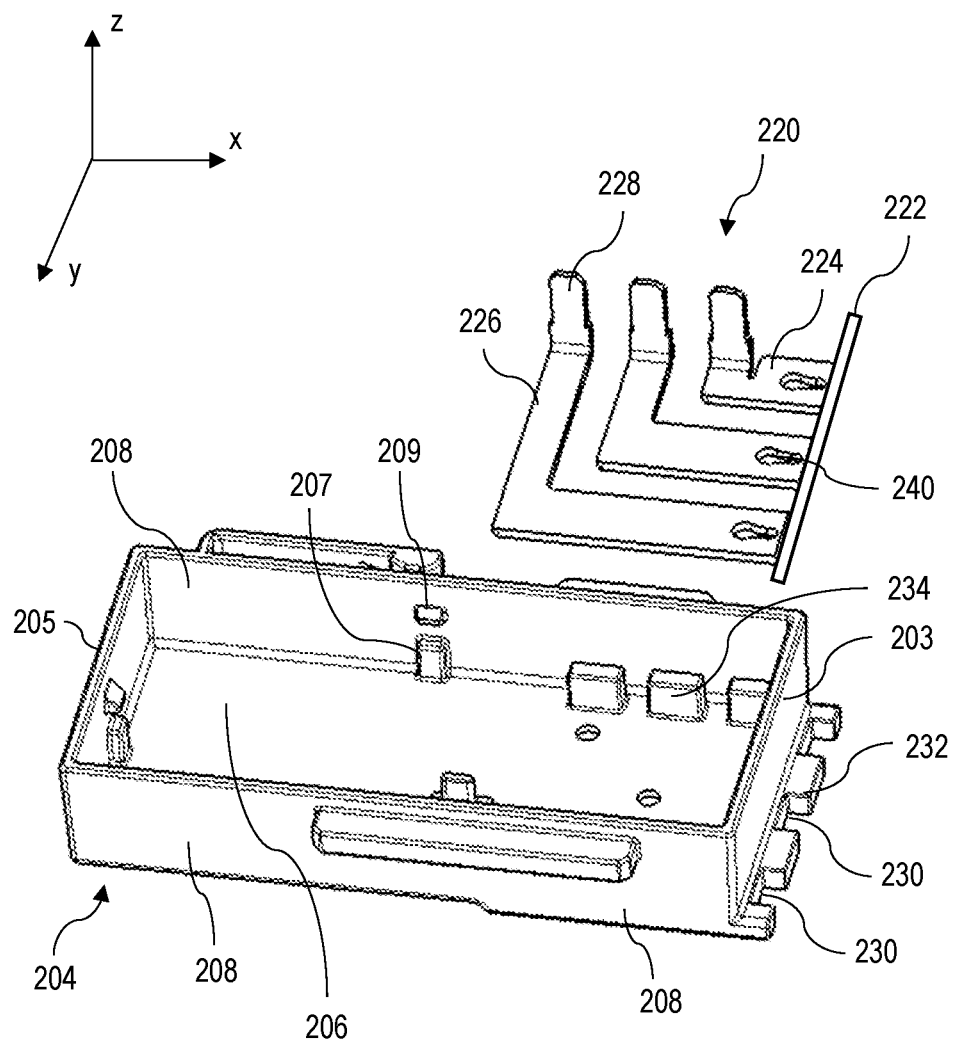
FIG. 9 depicts a perspective exploded view of a module housing and power terminals of the electronic power module, according to an embodiment.
Figure 10:
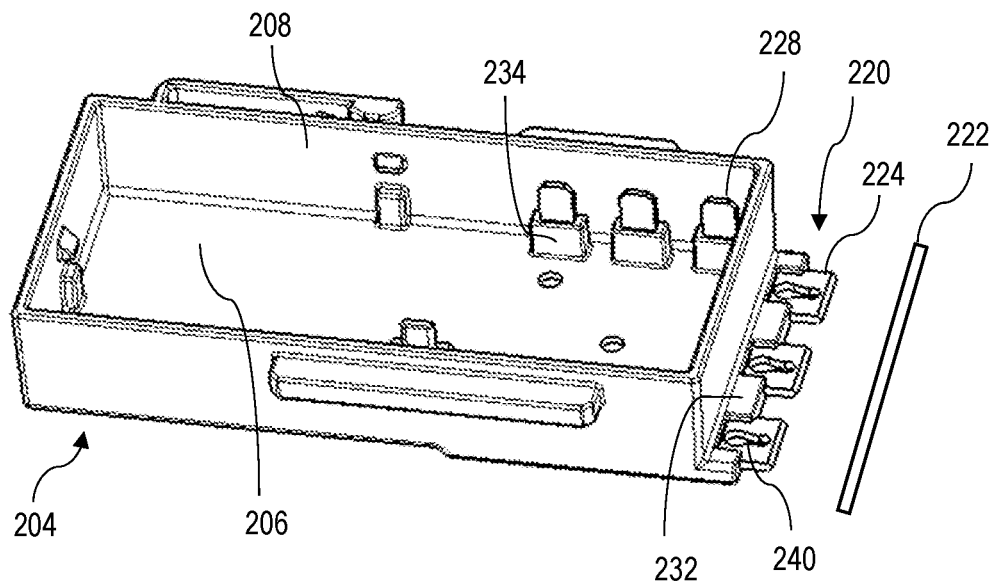
FIGS. 10 and 11 depict perspective views of the module housing and the power terminals, according to an embodiment.
Figure 11:
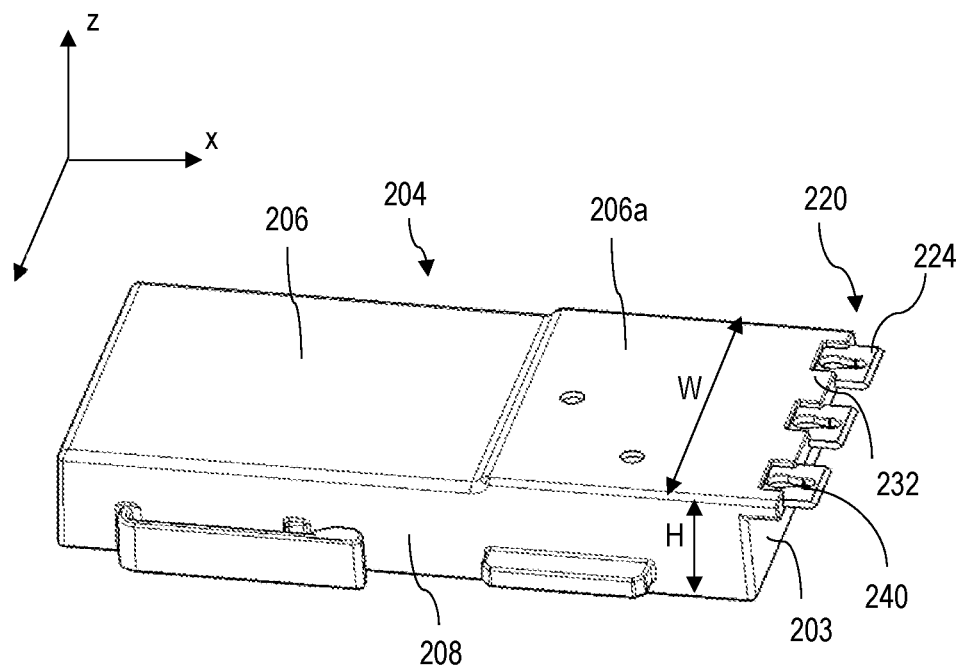

FIG. 9 depicts a perspective exploded view of the module housing 204 and the power terminals 220, according to an embodiment. FIGS. 10 and 11 depict perspective views of the module housing 204 and the power terminals 220, according to an embodiment.

In an embodiment, power terminals 220 are initially provided as a sub-assembly stamping held together via a link bar 222. The output terminals include first portions 224 extending from the link bar 222 along the x axis, second portions 228 extending perpendicularly along the z axis for coupling to the PCB 202, and a third portions 226 extending perpendicularly from ends of the first portions 224 opposite the link bar 222 along the y axis to bottom ends of the second portions 228. When assembled, x and y axis are on the horizontal plane of the bottom wall 206 of the module housing 204 and the z axis is parallel to the vertical plane of the side walls 208.

In an embodiment, the module housing 204 is molded via an insert-molding or over-molding process around the sub-assembly of the power terminals 220. The module housing 204 is formed such that the first portions 224 are for the most part embedded within the bottom wall 206, with ends of the first portions 224 extending through side openings 230 out of the module housing 204. In an embodiment, bottom wall 206 includes a thickened front portion 206a to accommodate the first portions 224 of the power terminals 220. In an embodiment, side openings 230 are formed through the front wall 203 in-line with the bottom wall 206. A series of side projections 232 are formed outside the front wall 203 between the ends of the first portions 224 to provide extra structural and insulation protection to the ends of the first portions 224 extending out of the module housing 204.

In an embodiment, the third portions 226 are similarly embedded within the bottom wall 206 extending approximately perpendicularly in the direction of one of the side walls 208. Second portions 228 extend perpendicularly from the bottom wall 206 adjacent and parallel to the side wall 208. In an embodiment, a series of inner posts 234 extend upwardly from the bottom wall 206 along the inner surface of the side wall 208. The inner ports 234 are formed around lower parts of the second portions 228 during the molding process, leaving upper tips of the second portions 228 exposed for connection with the PCB 202.

In an embodiment, once plastic or epoxy material has been shot into the mold and the molding process is completed, the link bar 222 is removed from the sub-assembly and discarded. This leaves the ends of the first portions 224 exposed outside the module housing 204 as terminals for connection with motor terminal wires (not shown) to be connected to the motor 100.

In an embodiment, the PCB 202 includes a series of peripheral slots 236 (FIG. 8) that receive the upper tips of the second portions 228 of the power terminals 220 when the PCB 202 is mounted inside the module housing 204 and snapped between retention features 207 and 209. In an embodiment, the upper tips of the second portions 228 are soldered to the PCB 202 prior to potting the module housing 204 with a potting compound.

In an embodiment, the potting compound may include thermally-conductive material to facilitate efficient heat transfer from the heat sinks 212.

In an embodiment, the ends of the first portions 224 of the power terminals 220 include holes 240. Motor terminal wires extending from the motor 100 are received within the holes 240 and secured to the power terminals 220 via soldering or welding. In an embodiment, each hole 240 is key-shaped and includes a small diameter portion for receiving a small-diameter motor terminal wire and a large diameter portion for receiving larger-diameter motor terminal wire.

Using this arrangement, instead of soldering motor terminal wires to the top surface of the PCB 202 and routing the motor terminal wires with tight turning radii along the top of the electronic control module 20, power terminals 220 are provided projecting axially through the front wall 203 of the module housing 104, typically in the direction of the motor 100. This allows a lower profile and shorter wire run compared to conventional module housing designs.

In an embodiment, the a total width W of the module housing 204 along the y axis is approximately in the range of 22 mm to 28 mm, preferably in the range of 23 mm to 27 mm, preferably in the range of 24 mm to 26 mm, preferably no more than 26 mm. In an embodiment, the total maximum height of the module housing 204 along the z axis is approximately in the range of 8 mm to 12 mm, preferably approximately 9 mm to 11 mm, preferably no more than 11 mm. In an embodiment, the power terminals 220 are oriented so as to be contained within a maximum peripheral envelope defined by the width W and height H of the module housing 204. Accordingly, the entirety of at least the front end of the module housing 204 including the front wall 203, the PCB 202 and it's components, the potting compound, all the power terminals 220, and the motor terminal wires (not shown) connected to the power terminals 220 forward of the module housing 204, can be contained within this maximum peripheral envelope. In an embodiment, this maximum peripheral envelope is smaller than or equal to approximately 284 mm^2, preferably smaller than or equal to approximately 275 mm^2, more preferably smaller than or equal to approximately 266 mm^2, even more preferably smaller than or equal to approximately 257 mm^2, and yet even more preferably smaller than or equal to approximately 251 mm^2. This improvement makes the electronic power module 20 particularly suitable for power tools having a small girth around the motor 100 and the electric power module 20, designed for single-hand grip by a user. In an embodiment, the power switches 210 are capable of delivering a power supply of at least approximately 600 watts to the motor 100.

Example embodiments have been provided so that this disclosure will be thorough, and to fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Terms of degree such as "generally," "substantially," "approximately," and "about" may be used herein when describing the relative positions, sizes, dimensions, or values of various elements, components, regions, layers and/or sections. These terms mean that such relative positions, sizes, dimensions, or values are within the defined range or comparison (e.g., equal or close to equal) with sufficient precision as would be understood by one of ordinary skill in the art in the context of the various elements, components, regions, layers and/or sections being described.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. An electronic module for controlling a motor, comprising:
    a module housing including a bottom surface, a plurality of walls, and an open face;
    a printed circuit board (PCB) arranged along a plane within the module housing;
    a plurality of power terminals; and a plurality of power switches mounted on the PCB to switchably connect a supply of electric power from a power source to the plurality of power terminals, wherein the plurality of power terminals comprises first portions projecting outside the module housing through one of the plurality of walls along a direction substantially parallel to the plane for coupling to a plurality of wires couplable to the motor, second portions extending substantially perpendicularly to the plane and electrically contacting the PCB, and third portions extending perpendicularly from inner ends of the first portions to the second portions along the plane.

2. The electronic module of claim 1, wherein the third portions are embedded within the bottom surface of the module housing.

3. The electronic module of claim 1, wherein the first portions are at least partially embedded within the bottom surface of the module housing.

4. The electronic module of claim 3, wherein the module housing is formed via a molding process to partially cover both surfaces of the first portion.

5. The electronic module of claim 1, wherein the module housing includes a plurality of inner posts formed along one of the plurality of walls around at least portions of the second portions of the plurality of power terminals.

6. The electronic module of claim 1, wherein the module housing includes a plurality of retaining features to support the PCB at a distance from the bottom surface.

7. The electronic module of claim 1, wherein the plurality of walls comprises two side walls extending along a longitudinal axis of the PCB and a front wall, wherein the first portions of the plurality of power terminals extend through the front wall.

8. The electronic module of claim 7, wherein the front wall has a maximum width of approximately less than or equal to 28 mm and a maximum height of approximately less than or equal to 12 mm, the plurality of power switches being configured to deliver at least approximately 600 watts of the electric power to the motor.

9. The electronic module of claim 8, wherein the electronic module is capable of being received within a peripheral envelope having an area that is smaller than or equal to approximately 284 mm^2.

10. An electric power tool comprising:
a tool housing;
an electric motor disposed in the housing;
an electronic module also disposed in a gripping handle of the housing, wherein the electronic module comprises:
a module housing including a bottom surface, a plurality of walls, and an open face;
a printed circuit board (PCB) arranged along a plane within the module housing;
a plurality of power terminals; and
a plurality of power switches mounted on the PCB to switchably connect a supply of electric power from a power source to the plurality of power terminals, wherein the plurality of power terminals comprises first portions projecting outside the module housing through one of the plurality of walls along a direction substantially parallel to the plane for coupling to a plurality of wires couplable to the motor, second portions extending substantially perpendicularly to the plane and electrically contacting the PCB, and third portions extending perpendicularly from inner ends of the first portions to the second portions along the plane.

11. The power tool of claim 10, wherein the third portions are embedded within the bottom surface of the module housing.

12. The power tool of claim 10, wherein the first portions are at least partially embedded within the bottom surface of the module housing.

13. The power tool of claim 12, wherein the module housing is formed via a molding process to partially cover both surfaces of the first portion.

14. The power tool of claim 10, wherein the module housing includes a plurality of inner posts formed along one of the plurality of walls around at least portions of the second portions of the plurality of power terminals.

15. The power tool of claim 10, wherein the module housing includes a plurality of retaining features to support the PCB at a distance from the bottom surface.

16. The power tool of claim 10, wherein the plurality of walls comprises two side walls extending along a longitudinal axis of the PCB and a front wall, wherein the first portions of the plurality of power terminals extend through the front wall.

17. The power tool of claim 16, wherein the front wall has a maximum width of approximately less than or equal to 28 mm and a maximum height of approximately less than or equal to 12 mm, the plurality of power switches being configured to deliver at least approximately 600 watts of the electric power to the motor.

18. The power tool of claim 17, wherein the electronic module is capable of being received within a peripheral envelope having an area that is smaller than or equal to approximately 284 mm^2.

* * * * *